United States Patent [19]

Ishida et al.

[11] Patent Number: 5,594,171
[45] Date of Patent: Jan. 14, 1997

[54] CAPACITANCE TYPE ACCELERATION SENSOR

[75] Inventors: Tatsuya Ishida; Yasuo Imaeda, both of Aichi, Japan

[73] Assignee: Kabushiki Kaisha Tokai Rika Denki Seisakusho, Aichi, Japan

[21] Appl. No.: 548,043

[22] Filed: Oct. 25, 1995

[30] Foreign Application Priority Data

Oct. 31, 1994  [JP]  Japan ................................ 6-267804

[51] Int. Cl.⁶ ........................... G01P 15/125; H01G 7/00
[52] U.S. Cl. ................................ 73/514.32; 73/514.38; 73/514.36; 361/280
[58] Field of Search ................... 73/514.18, 514.32, 73/514.36, 514.38; 361/280

[56] References Cited

U.S. PATENT DOCUMENTS

| | | | |
|---|---|---|---|
| 5,220,835 | 6/1993 | Stephan | 73/514.32 |
| 5,352,635 | 10/1994 | Tu et al. | 437/228 |
| 5,441,300 | 8/1995 | Yokota et al. | 280/735 |
| 5,487,305 | 1/1996 | Ristic et al. | 73/514.32 |

*Primary Examiner*—Hezron E. Williams
*Assistant Examiner*—Richard A. Moller
*Attorney, Agent, or Firm*—Finnegan, Henderson, Farabow, Garrett & Dunner, L.L.P.

[57] ABSTRACT

A compact capacitance type acceleration sensor in which a mass portion having a plurality of movable electrodes are arranged in a recess portion formed on the surface of a p-type single crystal silicon base plate under the condition that the mass portion can be displaced. A plurality of stationary electrodes are arranged at a position opposed to the movable electrodes being separate from the movable electrodes. The mass portion is elastically supported by a support from the lower side and also elastically supported by four beams from the lateral side. Due to the above structure, the damping characteristic of the mass portion can be improved.

6 Claims, 5 Drawing Sheets

CAPACITANCE TYPE ACCELERATION SENSOR

FIELD OF THE INVENTION

The present invention relates to a capacitance type acceleration sensor and a manufacturing method thereof.

BACKGROUND OF THE INVENTION

A strain gauge type acceleration sensor 30 of the bulk type shown in FIG. 12 is well known as an acceleration sensor used for ABS (the anti-lock brake system), the air bag system and the navigation system used for an automobile.

This type acceleration sensor 30 is manufactured in such a manner that a bulk of the single crystal base plate 31 made of silicon, the shape of which is rectangular parallelepipedic, and the crystal plane index of which is (100), is selectively etched from the front and reverse sides, that is, a bulk of the single crystal base plate 31 is subjected to crystal anisotropy etching. A detecting portion 32 formed by etching is composed of a mass portion 33 which functions as a weight, and a cantilever 34 for supporting the mass portion so that the mass portion can be displaced. A strain gauge composed of a plurality of diffusion strain resistances 35 is formed on an upper face of the cantilever 34. Accordingly, when an acceleration is impressed upon this acceleration sensor 30, the mass portion 33 is displaced in a predetermined direction, so that the cantilever 34 is bent. At this time, strain is induced in the diffusion strain resistance 35 provided on the cantilever 34. As a result, by the piezo-resistance effect of silicon, a resistance value of the diffusion strain resistance 35 is increased or decreased. When a change in the resistance value is detected, the acceleration can be found.

In this connection, in order to obtain a predetermined detection sensitivity by the conventional acceleration sensor 30, it is necessary to use a single crystal base plate 31 made of silicon, the thickness of which is at least 200 to 300 mm so that a thick mass portion 33 can be formed.

However, when the thick single crystal base plate 31 of silicon is etched from the reverse side, consideration must be given to the anisotropic etching characteristic, that is, consideration must be given to that an etching hole, the opening angle of which is q=125.26°, is formed along a plane of (111). Therefore, it is necessary to set the size of an opening portion "a" at a fairly high value. Due to the foregoing, width W of the chip is increased. Therefore, it is difficult to sufficiently reduce the dimensions of the overall acceleration sensor 30.

As a different type sensor from the above acceleration sensor 30, there is provided a surface and capacitance type acceleration sensor which is manufactured when a thin film formed on the front side of a silicon base plate is etched. In this type acceleration sensor, in a recess portion formed on the front side of the silicon base plate, there is provided a mass portion, which composes a detecting portion, supported by a support structure in such a manner that the mass portion can be displaced. On an upper surface of the mass portion, there are provided a plurality of movable electrodes. There are provided a plurality of stationary electrodes at positions respectively corresponding to the movable electrodes, wherein a predetermined distance is maintained between the stationary electrodes and the movable electrodes. Accordingly, when an acceleration is impressed upon this acceleration sensor, the mass portion is displaced. In accordance with the displacement of the mass portion, capacitance of a condenser formed by each movable and stationary electrode is changed. When the change in capacitance is detected, a direction and intensity of the impressed acceleration can be detected.

However, when the recess portion is formed on the surface of the silicon base plate, it is necessary to previously form a sacrifice layer because etching of sacrifice layer must be conducted. Therefore, the manufacturing process becomes complicated. Since it is common to support the mass portion with a cantilever in the case of a conventional surface and capacitance type acceleration sensor, the support structure tends to be damaged when a high intensity of acceleration is impressed upon the mass portion.

SUMMARY OF THE INVENTION

The present invention has been accomplished to solve the above problems. It is an object of the present invention to provide a compact capacitance type acceleration sensor, the mechanical strength of which is high. It is another object of the present invention to provide a method of manufacturing the above excellent capacitance type acceleration sensor easily.

According to a first aspect of the invention, there is provided a capacitance type acceleration sensor comprising: a silicon bass plate having a first recess portion on the surface thereof; a mass portion movably arranged in the first recess portion; a plurality of movable electrodes disposed on the mass portion; a plurality of stationary electrodes arranged so as to oppose to the movable electrodes and being separate from the movable electrodes; a support for elastically supporting the mass portion from the lower side of the mass portion; and a plurality of beams for elastically supporting the mass portion from the lateral side of the mass portion.

According to a second aspect of the invention, there is provided a method of manufacturing a capacitance type acceleration sensor including a p-type single crystal silicon bass plate having a recess portion on the surface thereof, a mass portion movably arranged in the recess portion, a support for elastically supporting the mass portion from the lower side of the mass portion and a plurality of beams for elastically supporting the mass portion from the lateral side of the mass portion, the method comprising the steps of: embedding and forming a first p-type silicon layer in the p-type single crystal silicon base plate; forming a second p-type silicon layer for communicating the embedded first p-type silicon layer with the outer surface of the p-type single crystal silicon base plate; conducting anode formation on the first and second p-type silicon layers so as to change both p-type silicon layers into a porous silicon layer; and conducting alkali-etching so as to remove the porous silicon layer and form the recess portion at the position where the porous silicon layer is removed and further to form the mass portion, the support and the beams in the recess portion.

According to a third aspect of the invention, there is provided a method of manufacturing a capacitance type acceleration sensor including a p-type single crystal silicon base plate having a recess portion on the surface thereof, a mass portion movably arranged in the recess portion, a plurality of movable electrodes disposed on the mass portion, a plurality of stationary electrodes arranged so as to oppose to the movable electrodes and being separate from the movable electrodes, a support for elastically supporting the mass portion from the lower side of the mass portion and a plurality of beams for elastically supporting the mass portion from the lateral side of the mass portion, comprising the steps of: forming a first p-type silicon diffusion layer in the predetermined region on the surface of the p-type single crystal silicon base plate; forming an n-type silicon layer so that the p-type silicon diffusion layer can be covered; forming a second p-type silicon diffusion layer for communicating the embedded first p-type silicon diffusion layer with the outer surface of the n-type silicon layer; conducting anode formation on both p-type silicon diffusion layers so as to change both p-type silicon diffusion layers into a porous silicon layer; forming the movable electrodes on the surface of the p-type single crystal silicon base plate on which the n-type silicon is formed by physical film forming method; conducting alkali-etching so as to remove the porous silicon layer and form the recess portion at the portion where the porous silicon layer is removed and further to form the mass portion, the support and the beam in the recess portion; and conducting anode-junction so as to join the glass base plate on which the stationary electrodes are formed, to the surface of the p-type single crystal silicon base plate.

BRIEF DESCRIPTION OF THE DRAWINGS

These and other features, aspects and advantages of the present invention will become better understood with reference to the following description, appended claims and accompanying drawings, in which:

DETAILED DESCRIPTION OF THE PREFERRED EMBODIMENT

Figure 1:
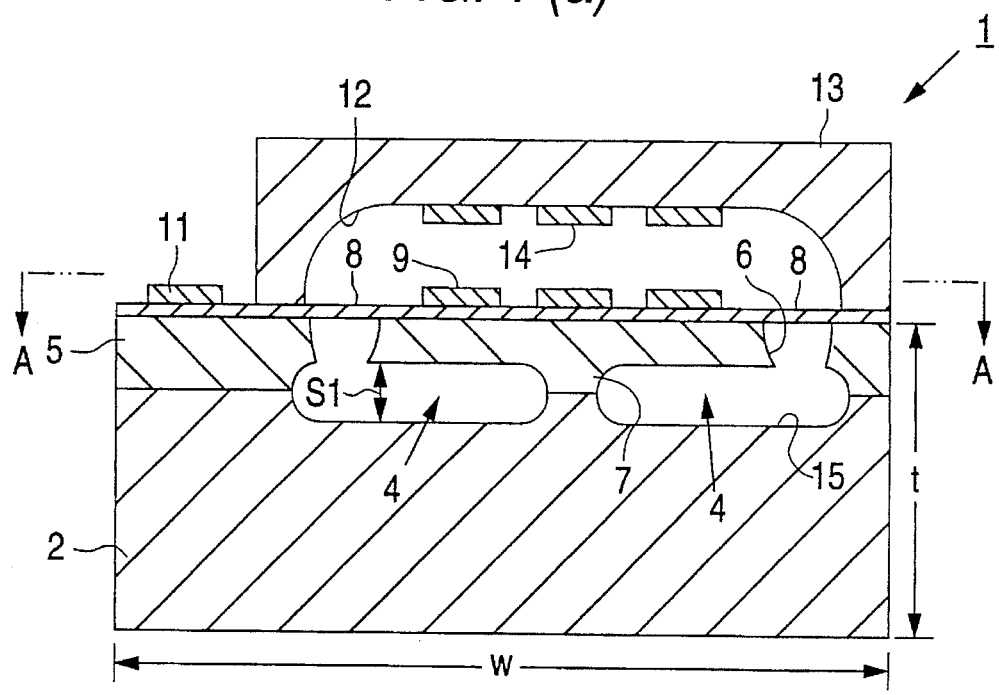
FIG. 1(a) is a schematic cross-sectional view showing the capacitance type acceleration sensor of the embodiment.
FIG. 1(b) is a cross-sectional view taken on line A—A in FIG. 1(a)
Figure 1:
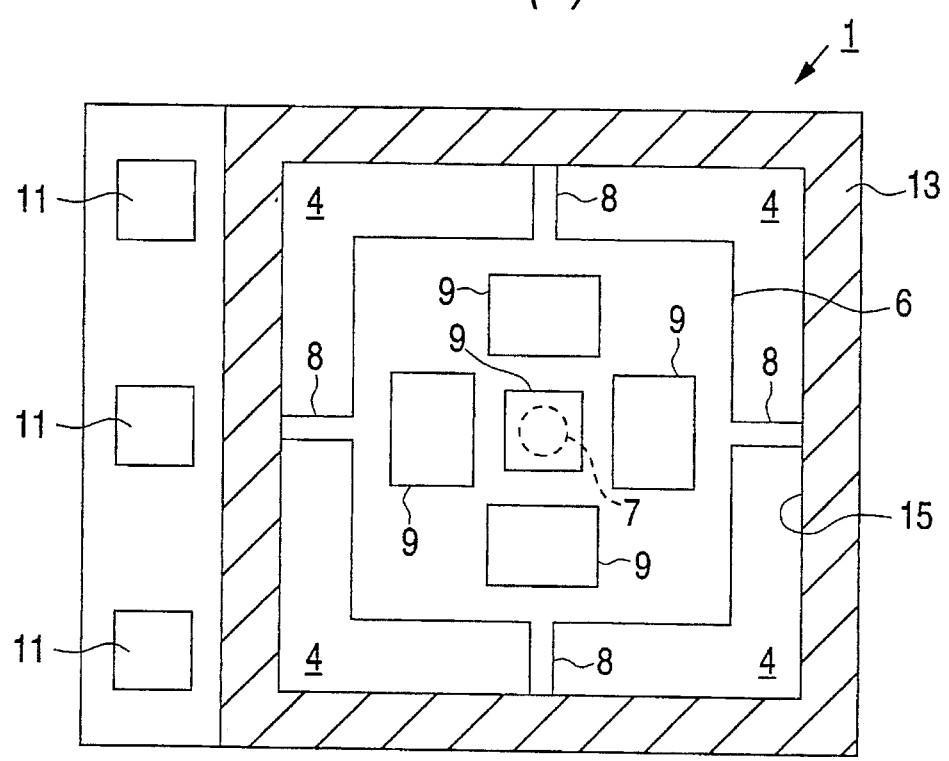

With reference to FIGS. 1 to 11, an embodiment of the present invention in which the present invention is embodied will be explained in detail as follows. In FIGS. 1(a) and 1(b), an arrangement of the capacitance type acceleration sensor 1 of this embodiment is schematically shown. Reference numeral 2 is a p-type single crystal base plate made of silicon, the crystal plane index of which is (110), which will be referred to as a silicon base plate in this specification, hereinafter. On an upper surface of the p-type single crystal base plate 2, there is formed an approximately square recess portion 15 obtained when a porous p-type silicon diffusion layer 3, 23 is subjected to alkali-etching. In this recess portion 15, there is provided a mass portion 6 mainly composed of an n-type silicon epitaxial growth layer 5 under the condition that the mass portion 6 can be displaced in the recess portion 15. There is provided one piece of support 7 at the center of the lower surface of the mass portion 6, that is, immediately below a gravity center of the mass portion 6. On the 4 lateral sides of the mass portion 6, there are respectively provided thin beams 8 which function as spring portions. Accordingly, the support 7 elastically supports the mass portion 6 from the lower side, and each beam 8 elastically supports the mass portion 6 from the lateral side.

On an upper surface of the mass portion 6, there are provided 5 movable electrodes 9 by the physical film forming method such as spattering or vapor-deposition. On an upper surface of the outer periphery of the silicon base plate 2, there are provided a plurality of bonding pads 11 formed by the same physical film forming method. The above movable electrodes 9 and the bonding pads 11 are electrically connected to each other by wiring patterns (not shown in the drawing) formed in a range from the upper surface of the mass portion 6 to the upper surface of the beam 8. These wiring patterns are formed by the same physical film forming method as that of the movable electrodes 9.

A glass base plate 13, on the reverse side of which a recess 12 is formed, is joined onto the upper surface of the silicon base plate 2 by the anode joining method. When the glass base plate 13 is joined onto the upper surface of the silicon base plate 2, a space for accommodating the mass portion 6 is formed by the above recess portion 12 and the recess portion 15 provided on the silicon base plate 2 side. In the recess 12 on the glass base plate 13 side, there are provided 5 stationary electrodes 14 by the physical film forming method. These stationary electrodes 14 are respectively arranged at positions opposing to the movable electrodes 9 under the condition that a predetermined distance is maintained between the stationary electrodes 14 and the movable electrodes 9. Accordingly, 5 condensers C1 to C5 are composed by these stationary electrodes 14 and the movable electrodes 9. The reference condenser C5 is arranged at a center of the mass portion 6, and other condensers C1 to C4 are arranged around the reference condenser C5. In this connection, each stationary electrode 14 is electrically connected to the bonding pad 11 by a wiring pattern not shown in the drawing. Each bonding pad 11 is subjected to wire bonding with respect to a capacitance detecting circuit (not shown) arranged outside the acceleration sensor 1.

In this embodiment, dimensions of each portion are described as follows. Width W and thickness t of the silicon base plate 2 (including the epitaxial growth layer 5) are respectively 1 mm and about 500 mm. Thickness of the mass portion 6 is approximately 20 mm. Clearance S1 between the bottom surface of the mass portion 6 and the inner bottom surface of the recess portion 15 is approximately 5 mm. Diameter of the support 7 is approximately 20 mm. Thickness, width and length of the beam 8 are respectively about 1 mm, 20 mm and 50 mm. Thickness of the movable electrode 9 and the bonding pad 11, which are formed by the physical film forming method, is approximately 1 mm. Distance between each movable electrode 9 and stationary electrode 14 is approximately 10 mm under the condition that an acceleration is not impressed as shown in FIG. 1(a).

Figure 2:
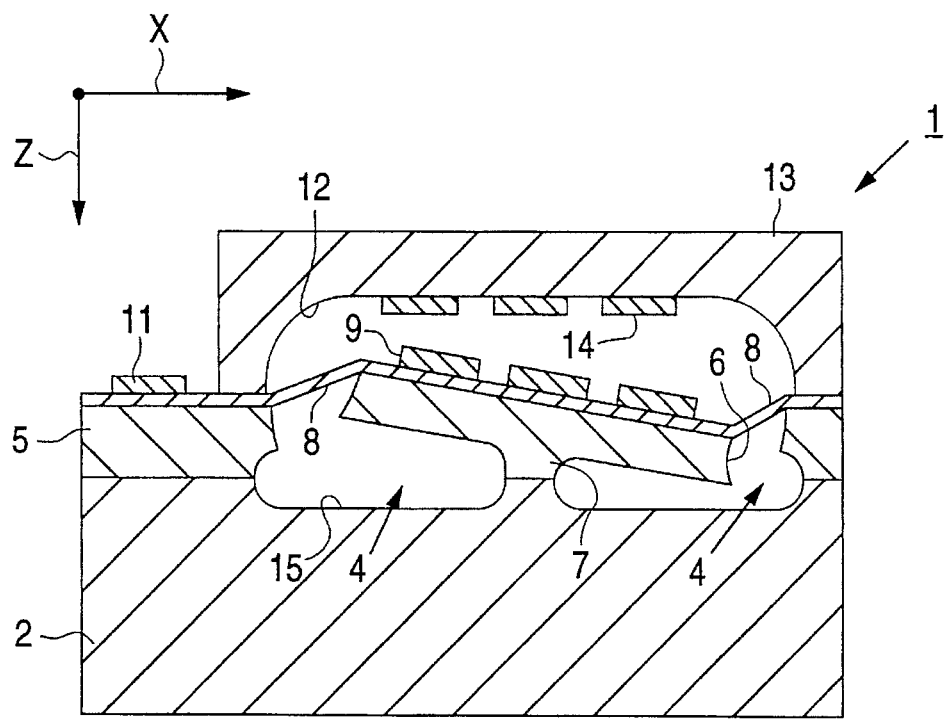
FIG. 2 is a schematic cross-sectional view showing a condition in which an acceleration is impressed upon the above acceleration sensor in the direction of X-axis.

FIG. 2 is a view showing a condition of displacement of the mass portion 6 upon which an acceleration is impressed in the direction of X-axis, that is, in the direction from the left to the right in FIG. 2 when the acceleration sensor 1 is put in the condition shown in FIG. 1(a). At this time, the left side of the mass portion 6 is displaced upward with respect to the fulcrum of the center, and the right side is displaced downward. Accordingly, a clearance between the movable electrode 9 and the stationary electrode 14, which form the condenser C1, is reduced, and a clearance between the movable electrode 9 and the stationary electrode 14, which form the condenser C2, is increased. At this time, an intensity of the acceleration in the direction of X-axis can be found from the difference value $\Delta C_x$ between the values of capacitance of the condensers C1 and C2 which are outputted to the capacitance detection circuit.

When an acceleration is impressed upon the acceleration sensor 1 in the direction of Y-axis, that is, in the direction perpendicular to the surface of FIG. 2 from the far side to the viewer's side, the mass portion 6 behaves in the same way as described above. That is, the far side end of the mass portion 6 is displaced upward, and the viewer's side end is displaced downward. At this time, an intensity of the acceleration in the direction of Y-axis can be found from the difference value $\Delta C_Y$ between the values of capacitance of the condensers C3 and C4. In this connection, FIGS. 4(a) and 4(b) are schematic wiring diagrams used for the operation conducted in accordance with the capacitance values of the condensers C1 to C5. The condenser Ct disposed on the lower side of FIG. 4(b) represents the 4 condensers C1 to C4 which are assumed to be one condenser Ct.

Figure 3:
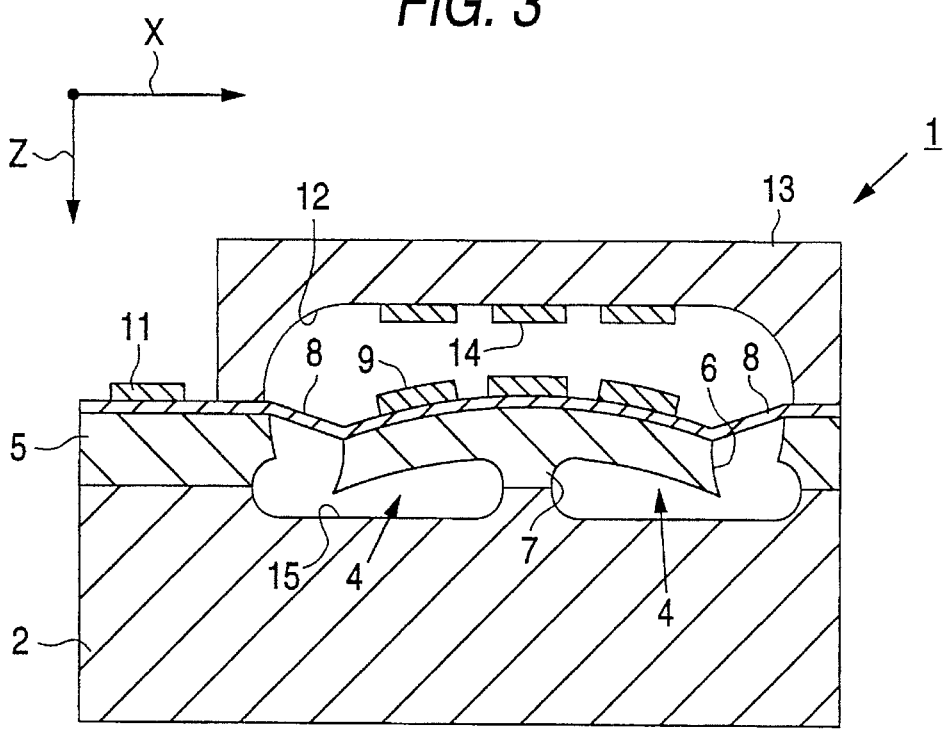
FIG. 3 is a schematic cross-sectional view showing a condition in which an acceleration is impressed upon the above acceleration sensor in the direction of Z-axis.
Figure 4:
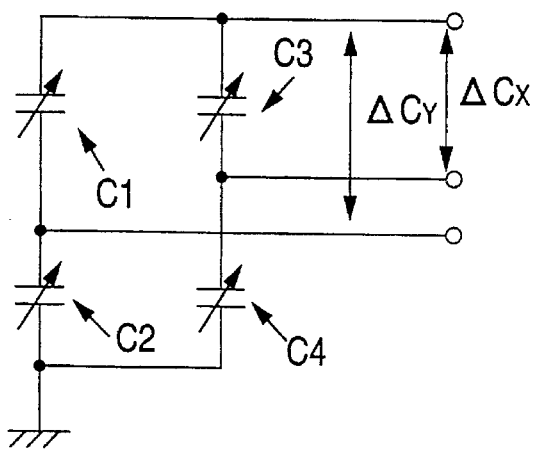
FIG. 4(a) is a schematic illustration showing a wiring pattern used for the operation conducted in accordance with the capacitance of each condenser.
FIG. 4(b) is a schematic illustration showing a wiring pattern used for the operation conducted in accordance with the capacitance of each condenser.
Figure 4:
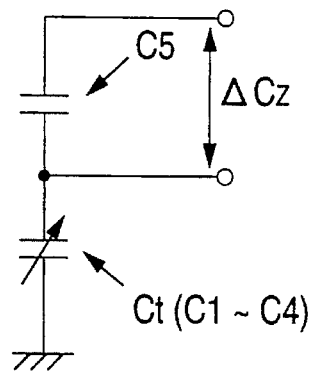

FIG. 3 is a view showing a condition of displacement of the mass portion 6 upon which an acceleration is impressed in the direction of Z-axis, that is, in the direction from the upside to the down-side in FIG. 3 when the acceleration sensor 1 is put in the condition shown in FIG. 1(a). Due to the action of the support 7, the center of the mass portion 6 is seldom displaced, and the outer periphery is displaced downward. Accordingly, a clearance between the movable electrode 9 composing the condensers C1 to C4 and the stationary electrode 14 is increased. On the other hand, a clearance between the movable electrode 9 composing the reference condenser C5 and the stationary electrode 14 is not particularly changed. At this time, an intensity of the acceleration in the direction of Z-axis can be found from the difference value $\Delta C_Z$ between the value of capacitance of the condensers C1 to C4 and the value of capacitance of the condenser C5.

Next, with reference to FIGS. 5 to 11, the manufacturing procedure of the acceleration sensor 1 of this embodiment will be explained as follows.

Figure 5:
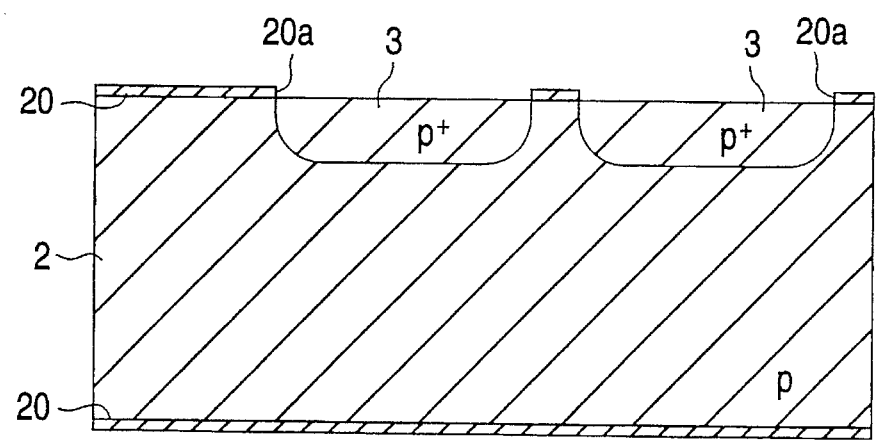
FIG. 5 is a schematic cross-sectional view showing the manufacturing procedure of an acceleration sensor.

First, an oxide film (film of $SiO_2$) 20 is formed on both sides of a p-type single crystal silicon base plate 2, the crystal plane index of which is (100). When this oxide film 20 is subjected to photo-etching, an approximately square opening 20a is formed in a predetermined region on the oxide film 20. However, at the center of the opening 20a, there is left a circular non-opening portion used for forming the support 7 in the successive process. Then, boron is driven into the opening 20a by means of ion injection, and the thus driven boron is thermally diffused. As a result, as shown in FIG. 5, a first p-type silicon diffusion layer 3, which is a first p-type silicon layer made of $p^+$ silicon, is formed in a predetermined region on the surface of the silicon base plate 2. After that, the oxide film 20 is removed from the silicon base plate 2 by means of etching.

Figure 6:
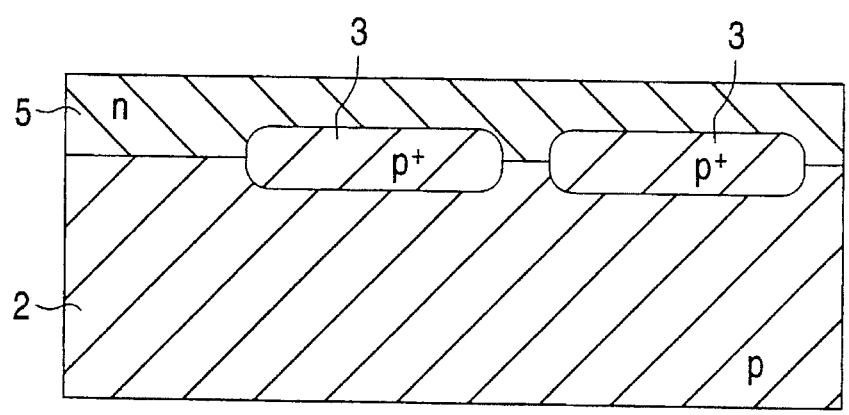
FIG. 6 is a schematic cross-sectional view showing the manufacturing procedure of an acceleration sensor.

Next, as shown in FIG. 6, an n-type silicon epitaxial growth layer 5 is formed by means of gas phase growth on an upper surface of the silicon base plate 2 on which the first p-type silicon diffusion layer 3 is formed. Then, an oxide film 22 is formed again on both sides of the silicon base plate 2 on which the epitaxial growth layer 5 is formed. After that, an approximately square opening 22a is formed in a predetermined region on the oxide film 22 by means of photo-etching.

Figure 7:
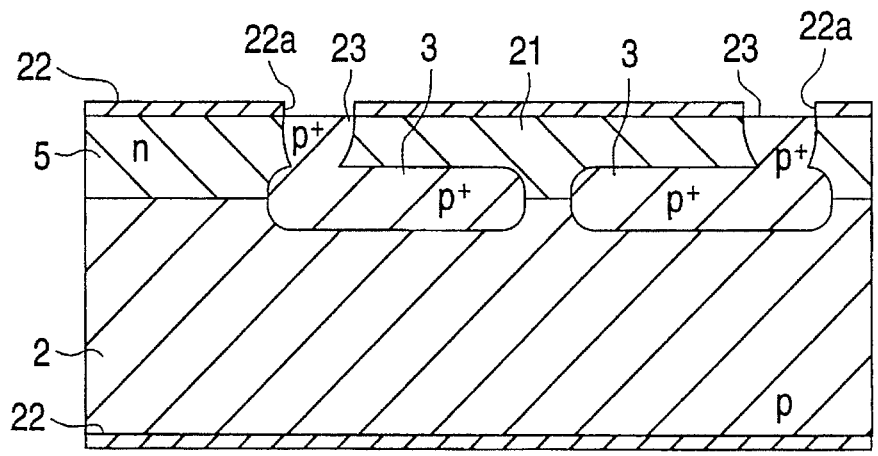
FIG. 7 is a schematic cross-sectional view showing the manufacturing procedure of an acceleration sensor.
Figure 8:
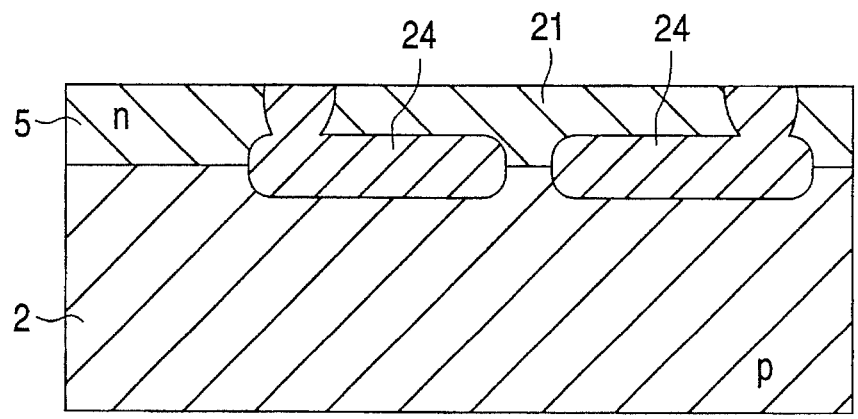
FIG. 8 is a schematic cross-sectional view showing the manufacturing procedure of an acceleration sensor.

Next, as shown in FIG. 7, boron is driven into the opening 22a by means of ion injection, and the thus driven boron is thermally diffused. As a result, a second p-type silicon diffusion layer 23, which is a second p-type silicon layer made of $p^+$ silicon, is formed in a predetermined region on the upper surface of the epitaxial growth layer 5. The newly formed p-type silicon diffusion layer 23 communicates the p-type silicon diffusion layer 3 embedded in the epitaxial growth layer 5 with an outer surface of the silicon base plate 2, that is, an outer surface of the epitaxial growth layer 5. Then, the oxide film 22 is removed from the silicon base plate 2 by means of etching.

Next, the silicon base plate 2 is dipped in an aqueous solution of hydrofluoric acid of high concentration. Under this condition, an electric current is made to flow while the silicon base plate 2 is used as an anode. When only the p-type silicon diffusion layers 3, 23 are selectively made to be porous by means of anode formation as described above, the porous silicon layer 24 shown in FIG. 8 is formed. After that, an oxide film 25 is formed again on both sides of the silicon base plate 2. When this oxide film 25 is subjected to photo-etching, a portion to be formed into a beam 8 in the successive process is formed above a portion where the second p-type silicon diffusion layer 23 was located. In this case, a photo-resist (not shown) is coated on an upper surface of the silicon base plate 2 on which the oxide film 25 is formed. Then the photo-resist is exposed to light and then developed.

Figure 9:
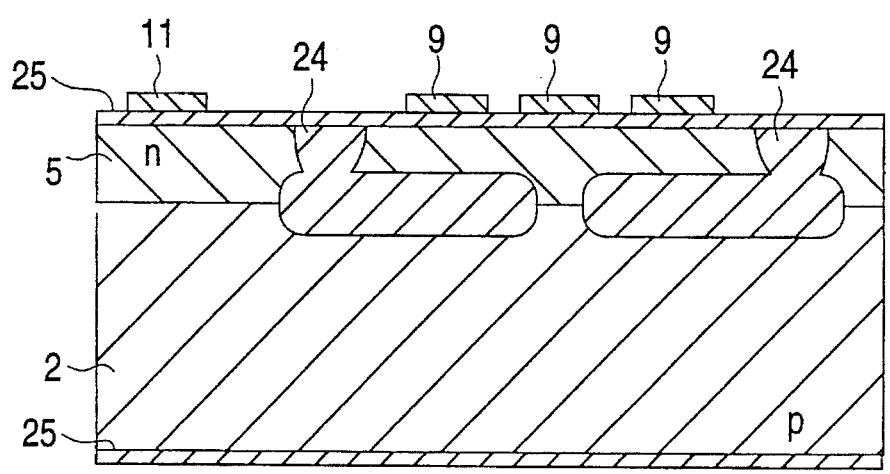
FIG. 9 is a schematic cross-sectional view showing the manufacturing procedure of an acceleration sensor.
Figure 10:
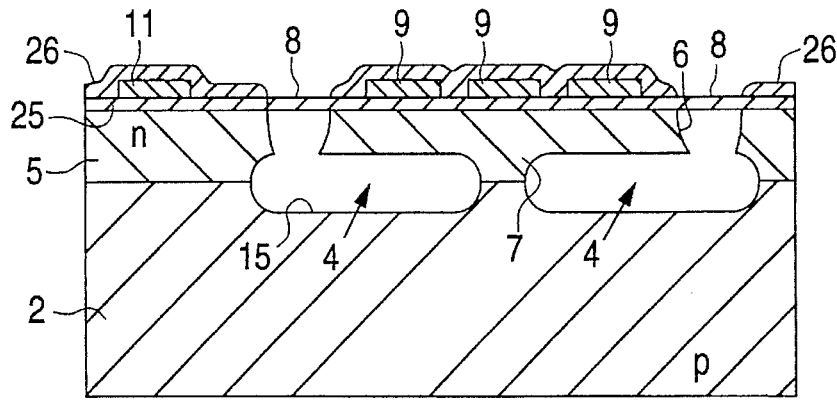
FIG. 10 is a schematic cross-sectional view showing the manufacturing procedure of an acceleration sensor.

Next, as shown in FIG. 9, by means of spattering or vapor-deposition of A, the movable electrode 9, bonding pad 11 and wiring pattern not shown are formed. After the photo-resist has been removed, the overall surface of the silicon base plate 2 is covered with the etching resist 26 except for the upper surface of a portion where the second p-type silicon diffusion layer 23 was located. In this case, the overall silicon base plate 2 is subjected to alkali-etching with TMAH (tetramethylammonium hydroxide). As a result, the porous silicon layer 24 is selectively etched as shown in FIG. 10, so that a cavity 4 is formed in the portion concerned. Accordingly, the recess 15 of a predetermined shape is formed on the surface of the silicon base plate 2. Portions of the epitaxial growth layer 5, which have not been etched, become a mass portion 6 and a support 7. On the sides of the mass portion 6, beams 8 are formed. After that, the unnecessary etching resist 26 is removed from the silicon base plate 2.

Figure 11:
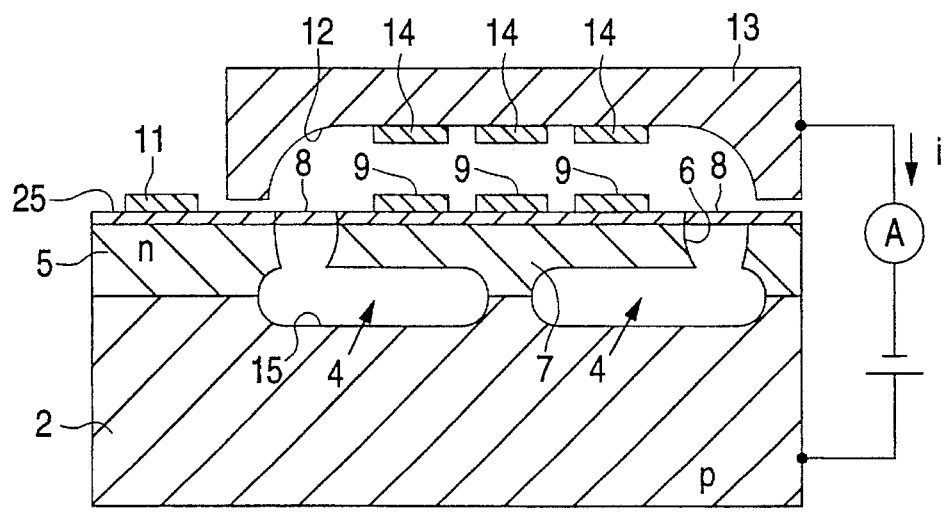
FIG. 11 is a schematic cross-sectional view showing the manufacturing procedure of an acceleration sensor.
Figure 12:
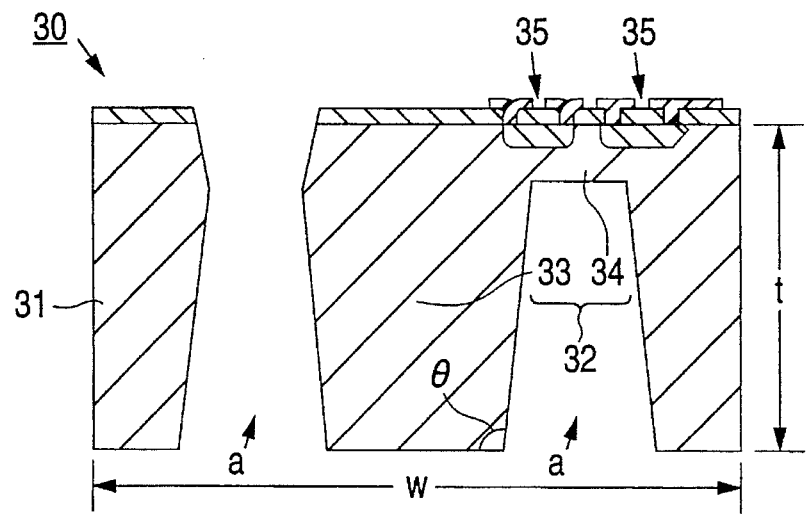
FIG. 12 is a schematic cross-sectional view showing the manufacturing procedure of a conventional acceleration sensor.

Then, as shown in FIG. 11, the recess 12 side of the glass base plate 13 is opposed onto the surface of the silicon base plate 2, and then a voltage of about 500 V is impressed at a temperature of 300° to 400° C., wherein the silicon base plate 2 is used as an anode. In this connection, a stationary electrode 14 and a wiring pattern are previously formed in the recess 12 of the glass base plate 13 by means of spattering of A. As a result of the anode junction described above, the glass base plate 13 is joined to the silicon base plate 2, and the acceleration sensor 1 shown in FIG. 1 is provided.

In the acceleration sensor 1 of this embodiment described above in detail, the mass portion 6 is elastically supported by the support 7 from the lower surface side and further elastically supported by the 4 beams 8 from the lateral side. Accordingly, compared with a structure in which the mass portion 6 is supported only by the support 7 or the beams 8, the damping characteristic of the detecting portion of this embodiment can be improved. Accordingly, even when a high intensity of acceleration is impressed upon the acceleration sensor 1, the support 7 and the beams 8, which are the support structure, are seldom damaged. For this reason, the mechanical strength of the acceleration sensor 1 is positively enhanced.

Since the acceleration sensor 1 is of the surface type, it is possible to manufacture the acceleration sensor 1 without conducting anisotropic etching from the reverse side of the silicon base plate 2. Accordingly, problems peculiar to the conventional bulk type acceleration sensor can be solved by the structure of this embodiment, that is, the problem of an increase in the chip width W caused in accordance with the formation of an etching hole along the face (111) can be solved. Consequently, it is possible to downsize the overall acceleration sensor 1 while the detection sensitivity of the sensor is maintained at a predetermined level.

According to the manufacturing method of this embodiment, when the first and second p-type silicon diffusion layers 3, 23 are made to be porous by means of anode formation, they are easily dissolved in alkali. Accordingly, when the porous silicon layer 24 is etched by alkali and the portion concerned is made to be a cavity, it is possible to positively and easily form the recess portion 15, mass portion 6, support 7 and beams 8 in predetermined portions. Due to the foregoing, it is not necessary to employ a conventional complicated procedure in which etching is conducted after a sacrifice layer has been formed. Consequently, it is possible to simplify the manufacturing process. Further, according to this manufacturing method in which the porous silicon layer 24 is removed, it is advantageous in that the plane orientation of the silicon base plate 2 is not particularly limited.

Further, the manufacturing method of this embodiment is essentially similar to the bipolar IC manufacturing process. Accordingly, this manufacturing method is advantageous in that the acceleration sensor 1 can be integrated with the bipolar IC into one unit. This is advantageous when the acceleration sensor 1 is downsized.

It should be noted that the present invention is not limited to the above specific embodiment. For example, it is possible to change the present invention as follows.

(1) Base plates except for the base plate, the crystal plane index of which is (110), may be used for the p-type single crystal silicon base plate 2, for example, base plates, the crystal plane index of which is (111) or (100), may be used for the p-type single crystal silicon base plate 2.

(2) As an alkaline etching agent except for TMAH, for example, KOH, hydrazine and EPW (ethylenediamine-pyrocatechol-water) may be used.

(3) Not only A but also, for example, Au may be selected as a metallic material to form the movable electrode 9, stationary electrode 14 and bonding pad 11.

(4) The number, shape and layout of the beams 8 may be different from those of the embodiment. That is, the number of the beams 8 may be not more than 3 or not less than 5. The shape of the beams 8 may not be straight, for example the shape of the beams 8 may be a wave-form. The beams 8 may be disposed at the corners of the mass portion 6.

(5) In the case of manufacturing of the acceleration sensor 1, instead of the n-type silicon epitaxial growth layers 5, for example, the n-type multi-crystal silicon layer or the amorphous silicon layer may be used.

(6) Except for the acceleration sensor 1 having 3 axes of the embodiment, of course, it possible to compose an acceleration sensor having 2 axes or 1 axis by reducing the number of electrodes.

(7) By the same manufacturing method as that of the embodiment, it is possible to manufacture an acceleration sensor in which the mass portion 6 is supported only by the beams 8 or alternatively the mass portion 6 is supported only by the support 7.

In this connection, the technical term used on this specification is defined as follows.

"Anode formation" is defined as a package quality improvement processing by which a porous layer is formed on a base plate when an electric current is caused to flow on the base plate disposed in an electrolyte under the condition that the base plate is used as an anode.

As described above in detail, according to the first aspect of the invention, it is possible to provide a compact capacitance type acceleration sensor, the mechanical strength of which is high. According to the second aspect of the invention, it is possible to easily manufacture the above excellent capacitance type acceleration sensor.

What is claimed is:

1. A capacitance type acceleration sensor comprising:
   a silicon bass plate having a first recess portion on the surface thereof;
   a mass portion movably arranged in said first recess portion;
   a plurality of movable electrodes disposed on said mass portion;
   a plurality of stationary electrodes arranged so as to oppose to said movable electrodes and being separate from said movable electrodes;
   a support for elastically supporting said mass portion from the lower side of said mass portion; and
   a plurality of beams for elastically supporting said mass portion from the lateral side of said mass portion.

2. The capacitance type acceleration sensor according to claim 1, wherein said support is integrally formed with said silicon base and extending from the bottom surface of said recess portion.

3. The capacitance type acceleration sensor according to claim 1, wherein said beams are extending from the lateral side surface of said recess portion.

4. The capacitance type acceleration sensor according to claim 1, further comprising:
   a bonding pad electrically connected to said movable electrodes, said bonding pad being formed on said silicon base plate.

5. The capacitance type acceleration sensor according to claim 1, further comprising:
   a glass base plate joined to the surface of said silicon base plate, said glass plate having a second recess portion in which said stationary electrode is disposed.

6. The capacitance type acceleration sensor according to claim 1, wherein the shape of said mass portion is approximately square, and said each beam is attached to the each side of said mass portion.

* * * * *